United States Patent
Purnell (10) Patent No.: US 12,435,902 B1
(45) Date of Patent: Oct. 7, 2025

(54) WEDGE APPARATUS FOR A CONTROLLED ENVIRONMENT SHELTER

(71) Applicant: Thomas L. Purnell, Genoa City, WI (US)

(72) Inventor: Thomas L. Purnell, Genoa City, WI (US)

( * ) Notice: Subject to any disclaimer, the term of this patent is extended or adjusted under 35 U.S.C. 154(b) by 0 days.

(21) Appl. No.: 17/221,738

(22) Filed: Apr. 2, 2021

Related U.S. Application Data (60) Provisional application No. 63/003,937, filed on Apr. 2, 2020.

(51) Int. Cl.
*H05K 7/20* (2006.01)
*F24F 13/08* (2006.01)

(52) U.S. Cl.
CPC .............. *F24F 13/08* (2013.01); *H05K 7/20* (2013.01); *H05K 7/20145* (2013.01)

(58) Field of Classification Search
CPC ........ F24F 13/08; H05K 7/20; H05K 7/20145
USPC .......................................................... 361/695
See application file for complete search history.

(56) References Cited

U.S. PATENT DOCUMENTS

| | | | | |
|---|---|---|---|---|
| 3,602,006 A * | 8/1971 | Metcalfe | ................... | F24F 1/02 62/262 |
| 4,092,088 A * | 5/1978 | Nemesi | ................. | F04D 29/626 417/423.1 |
| 4,261,255 A * | 4/1981 | Anderson | ............... | F24F 7/007 415/126 |
| 5,716,271 A * | 2/1998 | Paidosh | ................... | D06F 58/20 454/359 |
| 5,927,947 A * | 7/1999 | Botros | ..................... | G01M 1/32 416/241 A |
| 6,196,013 B1 * | 3/2001 | Kim | ........................ | F24F 1/027 62/262 |
| 6,524,064 B2 * | 2/2003 | Chou | ..................... | F04D 29/664 415/119 |
| 6,789,999 B2 * | 9/2004 | Bikos | ................. | B60H 1/00471 415/206 |
| 7,154,748 B2 * | 12/2006 | Yamada | ............. | H05K 7/20572 361/695 |
| 8,199,500 B2 * | 6/2012 | Yamagiwa | ......... | H05K 7/20127 165/104.34 |
| D663,019 S * | 7/2012 | Purnell | ........................ | D23/386 |
| D663,020 S * | 7/2012 | Purnell | ........................ | D23/386 |
| 8,446,725 B2 * | 5/2013 | Lam | .................... | H05K 7/20145 361/679.5 |
| D732,155 S * | 6/2015 | Purnell | ........................ | D23/386 |
| 9,267,701 B2 * | 2/2016 | Purnell | ........................ | F04D 29/4226 |
| 10,480,817 B2 * | 11/2019 | Kashihara | ............. | F24F 1/0022 |
| 2004/0253098 A1 * | 12/2004 | Hancock | ............... | F04D 29/424 415/206 |
| 2005/0109054 A1 * | 5/2005 | Eom | ..................... | F24F 1/0097 62/286 |
| 2007/0028638 A1 * | 2/2007 | Eom | ...................... | F24F 1/027 62/262 |

(Continued)

*Primary Examiner* — Anatoly Vortman
(74) *Attorney, Agent, or Firm* — Allison M. Corder (57) ABSTRACT

An apparatus configured to be used with a controlled environment shelter such as those that include HVAC systems. The apparatus comprises a body constructed from a plurality of panels. The body is constructed to include an interior space. Within the interior space are divider panels. The body panels and the divider panels form a channel that directs air flow from an HVAC system to the inside volume of the shelter.

16 Claims, 10 Drawing Sheets

(56) References Cited

U.S. PATENT DOCUMENTS

| | | | |
|---|---|---|---|
| 2008/0094799 A1* | 4/2008 | Zieman | F28F 9/0268 |
| | | | 361/695 |
| 2015/0071775 A1* | 3/2015 | Kashihara | F24F 1/0071 |
| | | | 415/206 |
| 2015/0219348 A1* | 8/2015 | Ikeda | F24F 7/065 |
| | | | 415/206 |

* cited by examiner

PRIOR ART

FIG. 1

PRIOR ART

WEDGE APPARATUS FOR A CONTROLLED ENVIRONMENT SHELTER

CROSS-REFERENCE TO RELATED APPLICATIONS

This application claims the benefit of prior-filed U.S. provisional patent application Ser. No. 63/003,937 filed Apr. 2, 2020.

FIELD OF THE INVENTION

The present invention relates generally to controlled environment shelters such as those that use heating, ventilation, and air conditioning ("HVAC") systems, and in particular, the present invention relates to an apparatus for use with such shelters to improve performance.

BACKGROUND OF THE INVENTION

A controlled environment shelter is a hut, enclosure, or box-like structure that encloses and protects infrastructure. Usually, controlled environment shelters enclose and protect infrastructure pertaining to communication equipment, such as telephone, Internet, computer, or surveillance equipment. Controlled environment shelters include temperature control equipment to maintain one or more specified temperatures in order to reduce the likelihood of damage to infrastructure. Temperature control equipment includes, for example, heating, ventilation, and air conditioning ("HVAC") systems, dehumidifiers, fresh air blowers, environment monitors and alarms, and electrical control panels and outlets.

Figure 1:
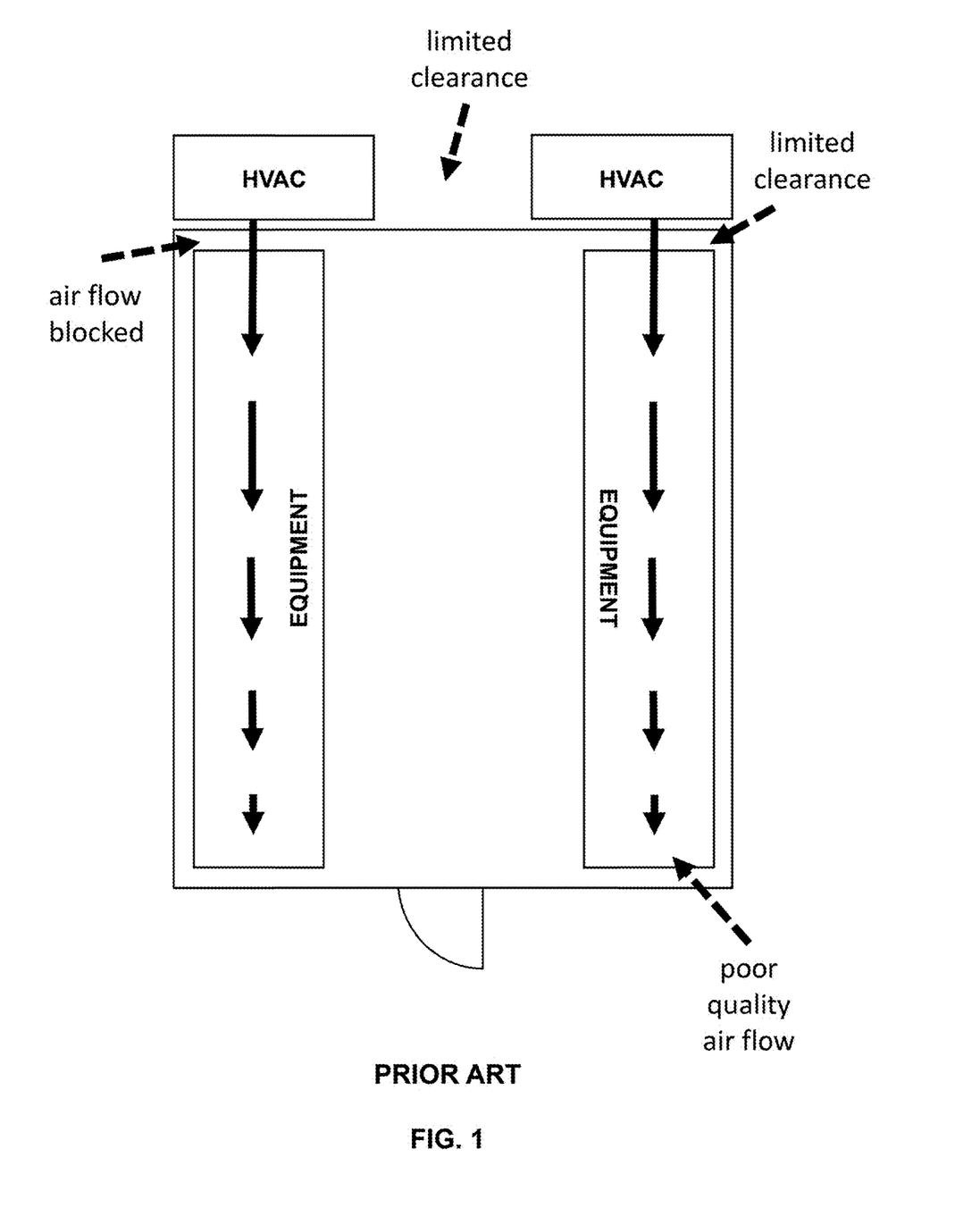
FIG. 1 illustrates a block diagram of a top view of an inside volume of a controlled environment shelter.
Figure 2:
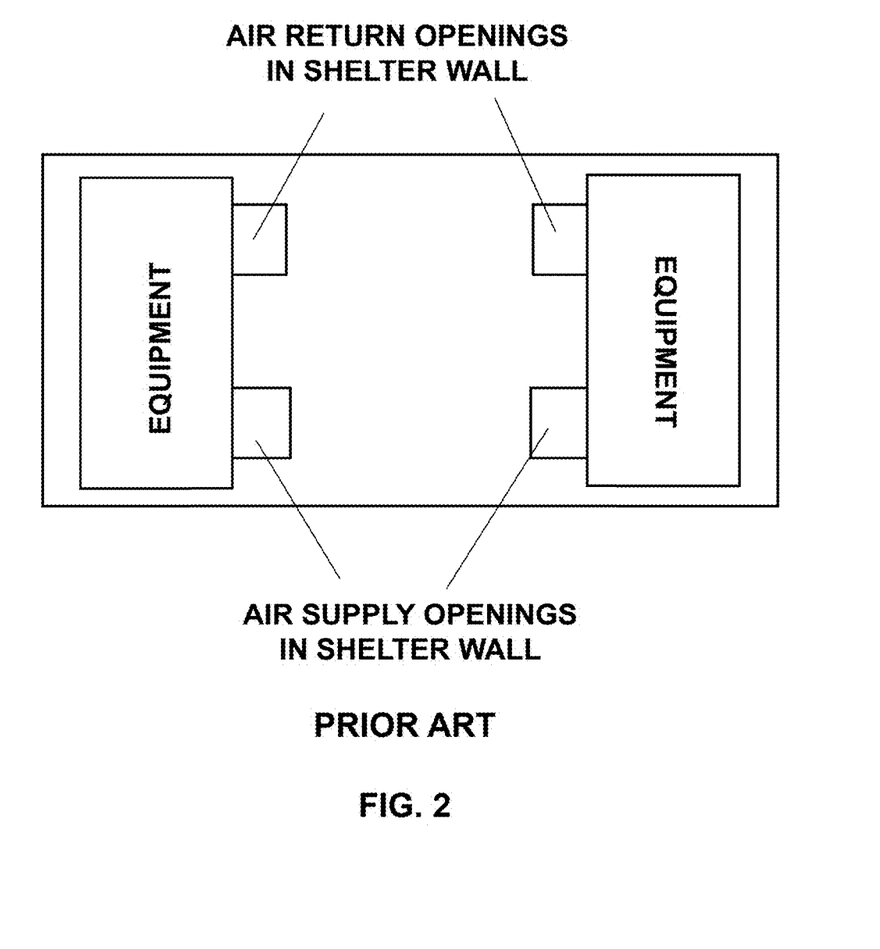
FIG. 2 illustrates a block diagram of a front view of the inside volume of the controlled environment shelter.

Most controlled environment shelters that enclose and protect communication equipment include a traditional air conditioning system. FIG. 1 illustrates a top view of an inside volume of a shelter and FIG. 2 illustrates a front view of the inside volume of the shelter. In this example, two equipment racks are positioned within the shelter. One or more HVAC systems are positioned near one end of each of the equipment racks and are each located on a wall outside the shelter. The shelter wall includes an air supply opening and an air return opening (see FIG. 2). The HVAC system supplies air to the inside volume of the shelter through the air supply opening. Air exits from the inside volume of the shelter through the air return opening.

As highlighted in FIG. 1, there are issues with this current design. Clearance is limited between two or more HVAC systems. Clearance is limited also between the HVAC system and the equipment rack. These limited clearances make it difficult to access and service the shelter including equipment and HVAC system. Another issue related to this shelter design is blocked air flow—one end of the equipment rack is located directly in front of the air supply opening. All or a portion of air supplied from the HVAC system is blocked by the equipment (see also FIG. 2). This prevents uniform cooling. With the flow of air passing directly towards an end of the equipment rack, the other end of the equipment rack (furthest from the air supply opening) does not experience the same quality—temperature, velocity, mass, etc.—air. If equipment is not cooled properly, it may overheat and malfunction such as reduced run-time and increased energy consumption, or even worse, complete shut-down.

There is a demand for improved controlled environment shelters that minimize maintenance, energy cost, and repair cost. The present invention satisfies this demand.

SUMMARY OF THE INVENTION

The present invention is an apparatus for installation on a controlled environment shelter. The apparatus is located on a wall outside the shelter, specifically between the wall of the shelter and the HVAC system. Specifically, the apparatus relocates the HVAC system from located on the wall of the shelter to positioned at a distance from the wall and oriented at an angle to the wall. This increases the clearance between the locations of the HVAC systems as well as increases the clearance between the HVAC system and the equipment rack.

Figure 3:
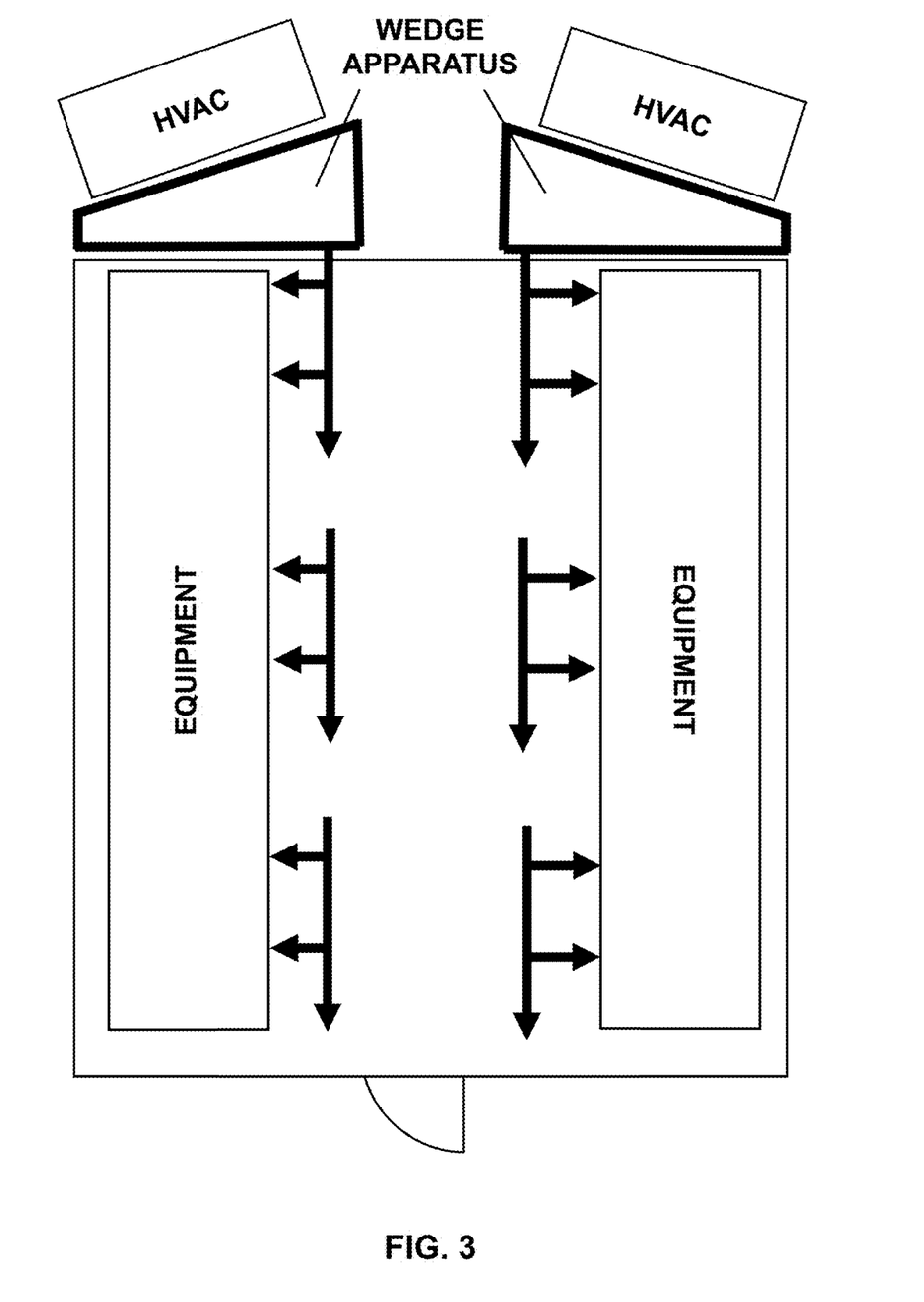
FIG. 3 illustrates a block diagram of a top view of an inside volume of a controlled environment shelter that uses an apparatus according to an embodiment of the invention.

It is contemplated that a shelter may require more than one apparatus as shown in FIG. 3. For example, a shelter with two HVAC systems may utilize two apparatuses. When more than one apparatus is used, each apparatuses is positioned to provide a sufficient clearance between each of the HVAC systems as well as to provide a sufficient clearance between each HVAC system and the end of the equipment rack. This permits easy and comfortable access to the equipment or HVAC systems, such as during servicing.

Figure 4:
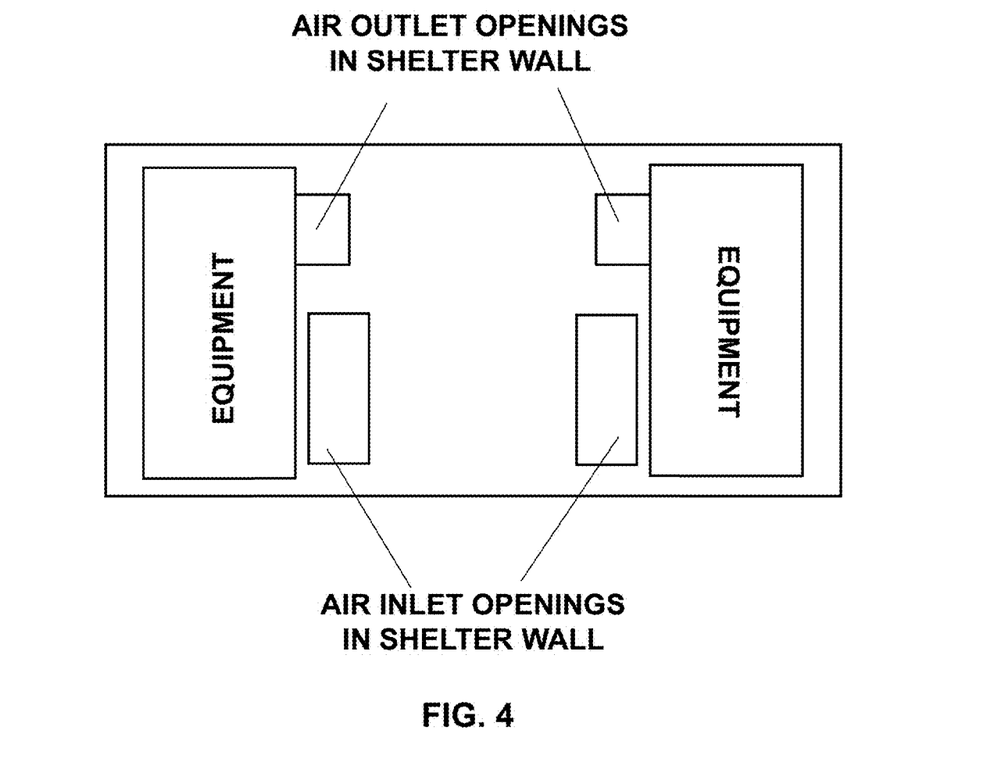
FIG. 4 a block diagram of a front view of the inside volume of a controlled environment shelter that uses an apparatus according to an embodiment of the invention.

FIG. 4 illustrates the orientation openings in a wall of a shelter that is contemplated for use with the apparatus according to the invention. Although the air inlet opening (which supplies air from the HVAC system into the shelter) is illustrated as being a rectangular shape and located vertically near the bottom of the shelter, any shape or location (e.g., horizontal rectangle located near the top of the shelter) is contemplated. However, the air inlet opening should be fabricated to match an opening of a panel in the apparatus. Preferably, the air inlet opening is oriented so that it is not blocked by an end of the equipment rack (see FIG. 2). Here, the inlet openings are shown in the form of a vertical rectangle so that air is directed along the front of the equipment rack. This provides equipment at both ends of the rack to experience the same or similar quality of air.

The apparatus is configured to direct a supply air flow from an HVAC system to an inside volume of the shelter, and to further direct a return air flow from the inside volume of the shelter to outside the shelter.

The apparatus comprises a body constructed from a plurality of panels—two or more of the panels include aperture elements. A first set of aperture elements are configured to be of a shape and size that works with the air supply and return of a HVAC system. A second set of aperture elements are configured to be of a shape and size that matches the air inlet opening and air outlet opening in a wall of a shelter. The body is constructed to form an interior space. Within the interior space are divider panels. The body panels and the divider panels form a channel that directs air flow from an HVAC system to the inside volume of the shelter.

The described embodiments are to be considered in all respects only as illustrative and not restrictive, and the scope of the invention is not limited to the foregoing description. Those of skill in the art will recognize changes, substitutions and other modifications that will nonetheless come within the scope of the invention and range of the claims.

DESCRIPTION OF THE DRAWING

The preferred embodiments of the invention will be described in conjunction with the appended drawing provided to illustrate and not to the limit the invention, where like designations denote like elements, and in which.

DETAILED DESCRIPTION OF THE INVENTION

The present invention relates generally to an apparatus for use with a controlled environment shelter such as those that use heating, ventilation, and air conditioning ("HVAC") systems or systems. The apparatus may improve performance by minimizing maintenance, energy cost, and repair cost of the equipment enclosed within the shelter.

Figure 5:
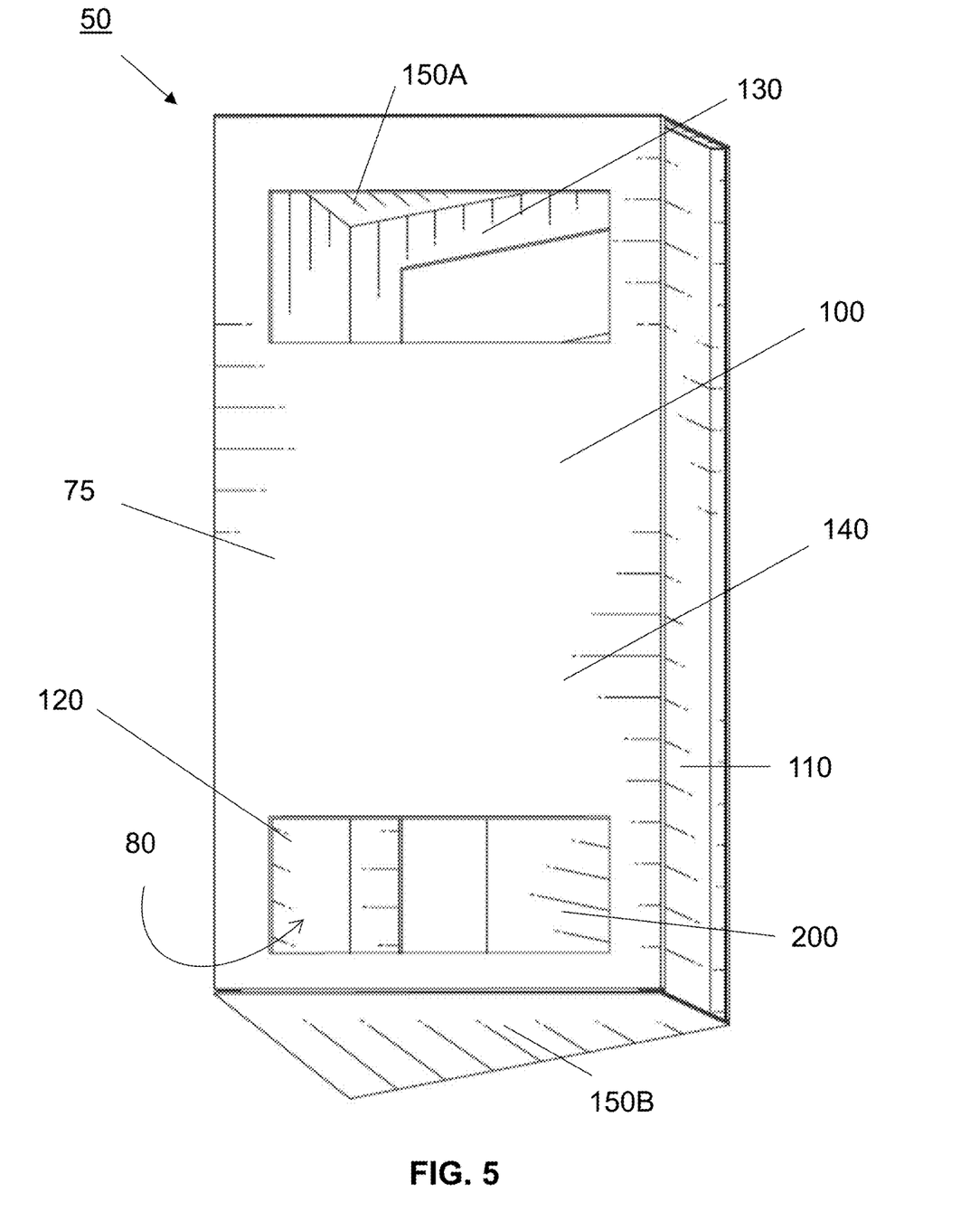
FIG. 5 illustrates an perspective front view of the apparatus according to an embodiment of the invention.

The apparatus 50 is shown in FIG. 5 and comprises a body 75 constructed from a plurality of panels 100. The plurality of panels comprise of a first side panel 110, second side panel 120, a first cutout side panel 130, a second cutout side panel 140, an end panel 150, a horizontal divider panel 160, and a vertical divider panel 170.

Two of the panels 100 include aperture elements 200. A first set of aperture elements 210, 220 on a first panel 130 are configured to be of a shape and size that works with the air supply and return of a HVAC system. A second set of aperture elements 230, 240 on a second panel 140 are configured to be of a shape and size that matches the air inlet opening and air outlet opening in a wall of a shelter. The body 75 is constructed to include an interior space 80. Within the interior space are panels 150, 160, 170 that divide the interior space 80. The body panels 110, 120, 130, 140, and the divider panels 150, 160, 170 form channels—a first channel 310 and a second channel 320—that each direct air flow from an HVAC system to the inside volume of the shelter.

Figure 6A:
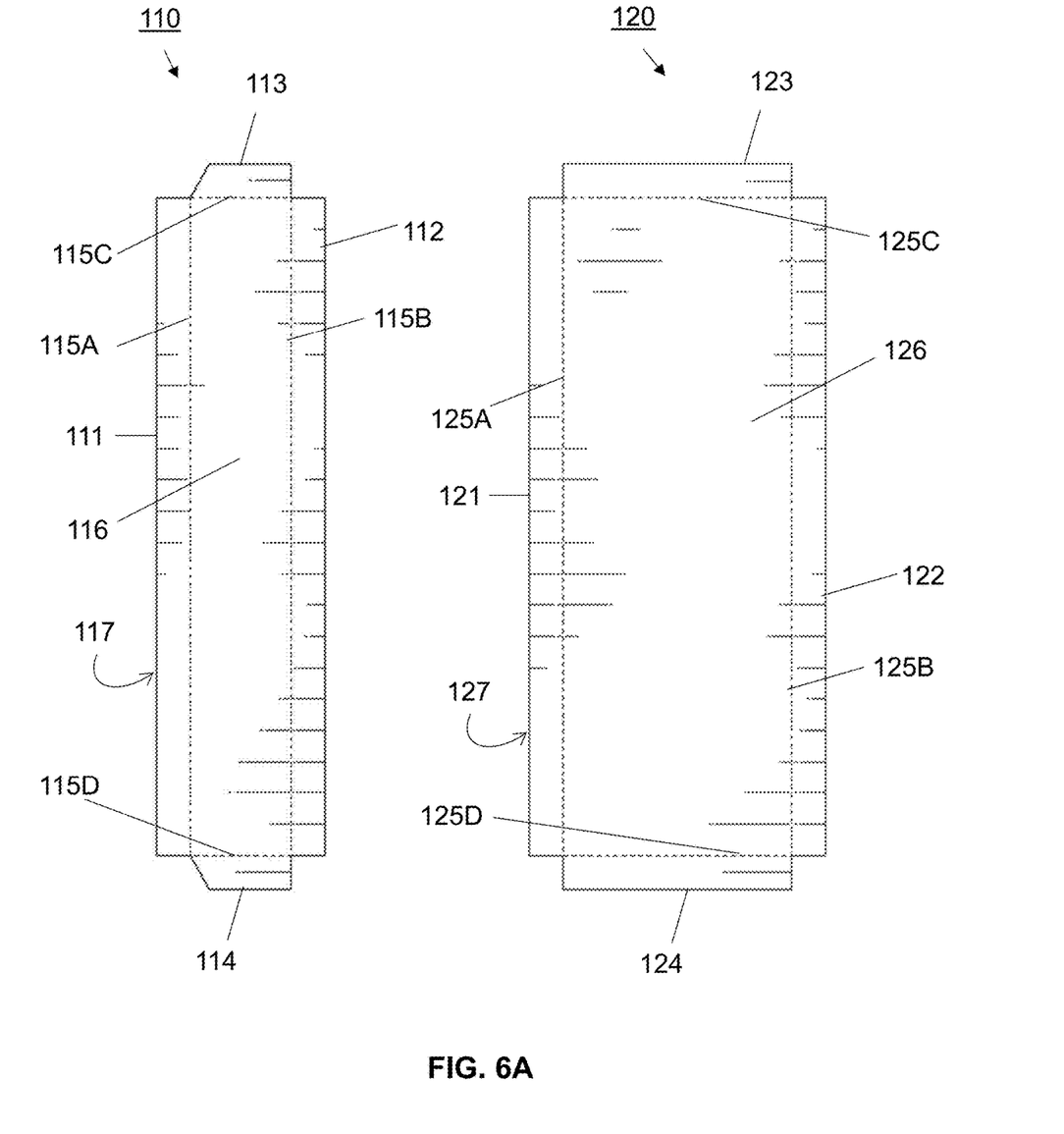
FIG. 6A illustrates a first side panel and a second side panel of an apparatus according to an embodiment of the invention.
Figure 6B:
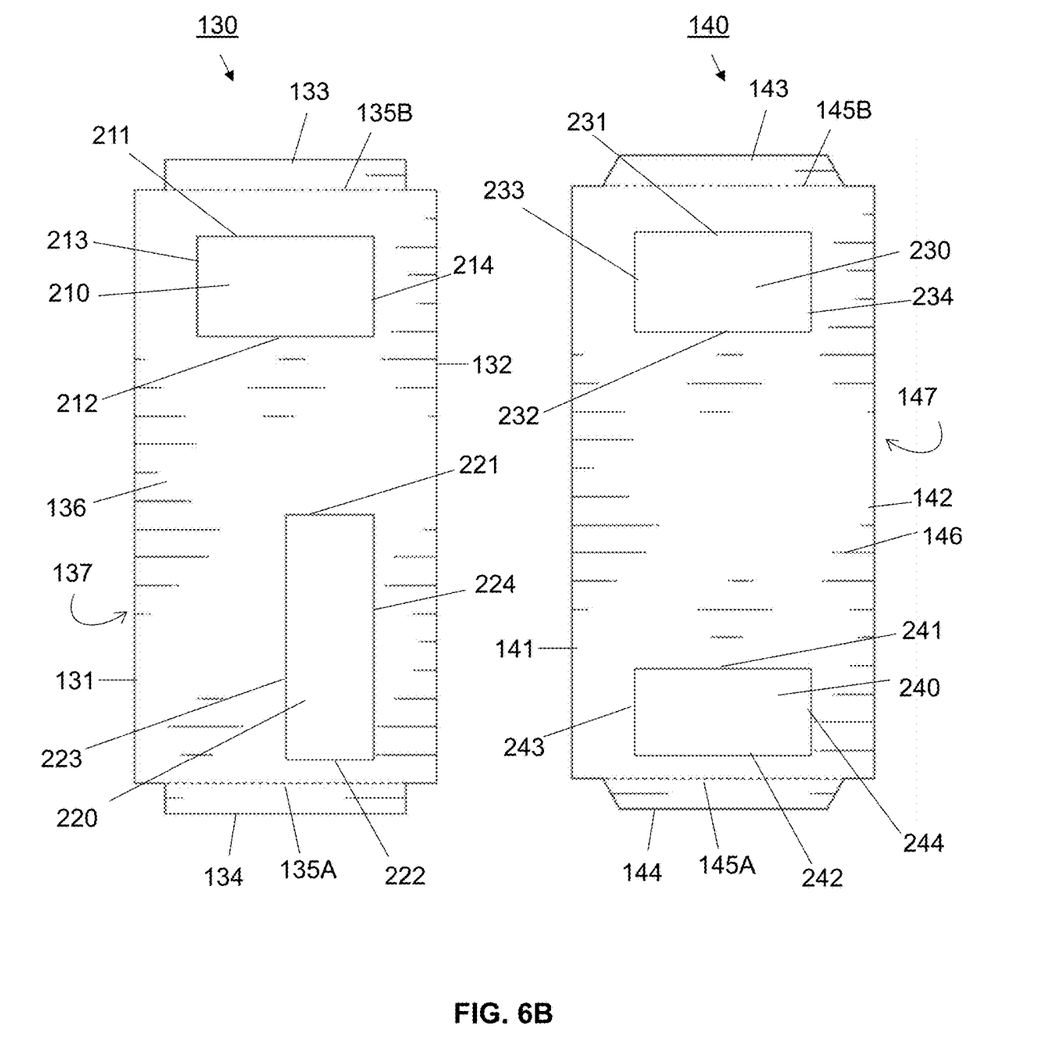
FIG. 6B illustrates a first cutout side panel and a second cutout side panel of an apparatus according to an embodiment of the invention.
Figure 6C:
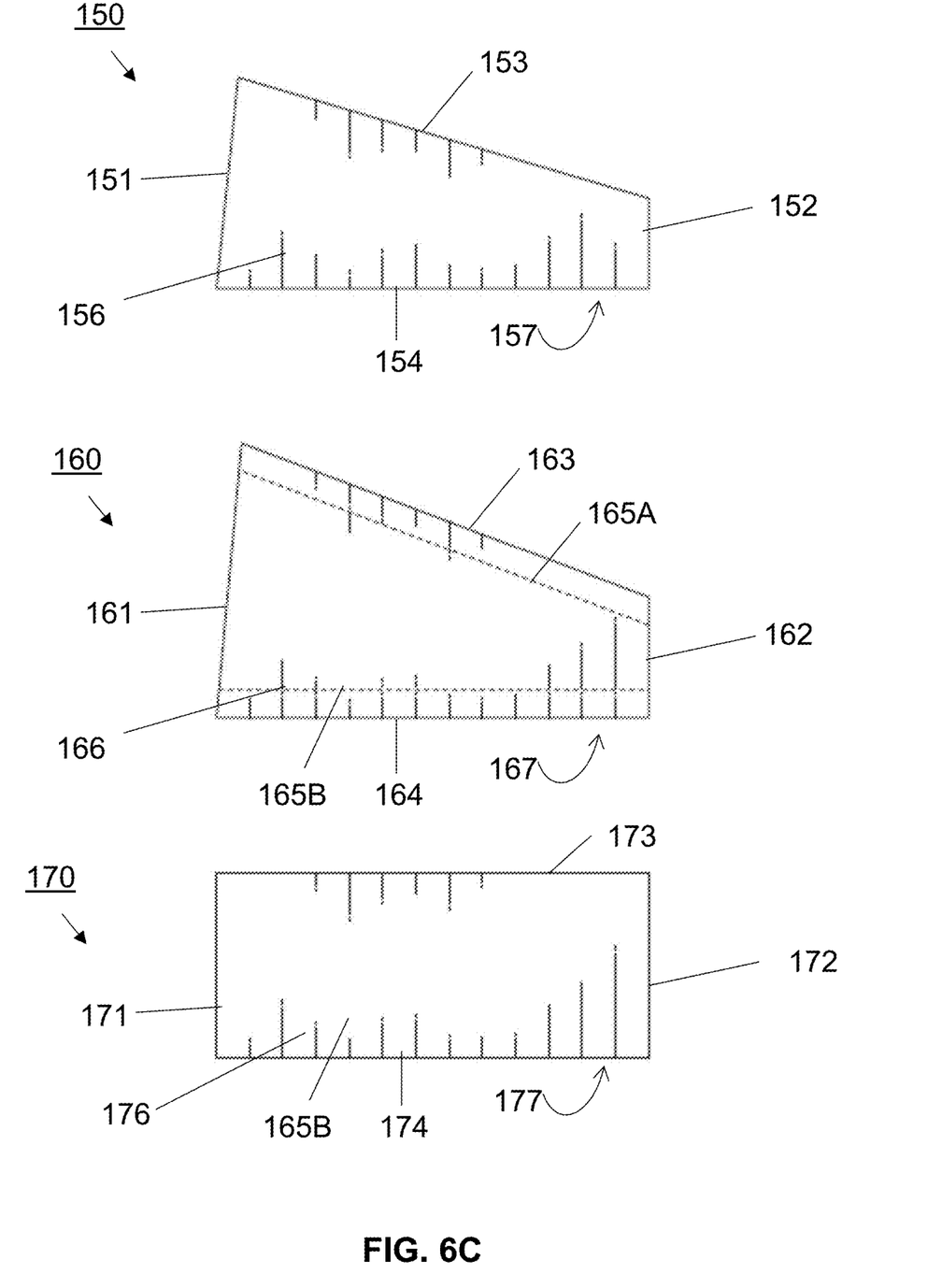
FIG. 6C illustrates an end panel, a horizontal divider panel, and a vertical divider panel of an apparatus according to an embodiment of the invention.

The panels 110, 120, 130, 140 to construct the body 75 of the apparatus 50 are shown in FIG. 6A, 6B, 6C. FIG. 6A illustrates a first side panel 110 and a second side panel 120 of an apparatus according to an embodiment of the invention. The first side panel 110 is defined by a first edge 111 opposing a second edge 112, each between a third edge 113 opposing a fourth edge 114. The first side panel 110 includes a first surface 116 and a second surface 117. Positioned on the surfaces 116, 117 and at a distance from each edge 111, 112, 113, 114 are fold lines 115A, 115B, 115C, 115D.

The second side panel 120 is defined by a first border 121 opposing a second border 122, each between a third border 123 opposing a fourth border 124. The second side panel 120 includes a first surface 126 and a second surface 127. Positioned on the surfaces 126, 127 and at a distance from each border 121, 122, 123, 124 are fold lines 125A, 125B, 125C, 125D.

FIG. 6B illustrates a first cutout side panel 130 and a second cutout side panel 140 of an apparatus according to an embodiment of the invention.

The first cutout side panel 130 is defined by a first edge 131 opposing a second edge 132, each between a third edge 133 opposing a fourth edge 134. The first cutout side panel 130 includes a first surface 136 and a second surface 137. Positioned on the surfaces 136, 137 and at a distance from each edge 133, 134 are fold lines 135A, 135B. The first cutout side panel 130 includes a first aperture element 210 and a second aperture element 220. The first aperture element 210 is configured as a horizontal rectangle and the second aperture element 220 is configured as a vertical rectangle. The first aperture element 210 is defined by a first boundary 211 opposing a second boundary 212, each between a third boundary 213 opposing a fourth boundary 214. Similarly, the second aperture element 220 is defined by a first boundary 221 opposing a second boundary 222, each between a third boundary 223 opposing a fourth boundary 224.

The second cutout side panel 140 is defined by a first border 141 opposing a second border 142, each between a third border 143 opposing a fourth border 144. The first cutout side panel 140 includes a first surface 146 and a second surface 147. Positioned on the surfaces 146, 147 and at a distance from each border 143, 144 are fold lines 145A, 145B. The first cutout side panel 140 includes a third aperture element 230 and a fourth aperture element 240. Both the third aperture element 230 and the fourth aperture element 240 are each configured as a horizontal rectangle. The third aperture element 230 is defined by a first boundary 231 opposing a second boundary 232, each between a third boundary 233 opposing a fourth boundary 234. Similarly, the fourth aperture element 240 is defined by a first boundary 241 opposing a second boundary 242, each between a third boundary 243 opposing a fourth boundary 244.

As shown, the aperture elements 210, 220, 230, 240 are rectangular shape, but any number of boundaries are contemplated to form any shape, which may be required by the shelter and HVAC system.

FIG. 6C illustrates an end panel 150, a horizontal divider panel 160, and a vertical divider panel 170 of an apparatus according to an embodiment of the invention.

The end panel 150 is defined by a first edge 151 opposing a second edge 152, each between a third edge 153 opposing a fourth edge 154. The first side panel 150 includes a first surface 156 and a second surface 157.

The horizontal divider panel 160 is defined by a first border 161 opposing a second border 162, each between a third border 163 opposing a fourth border 164. The horizontal divider panel 160 includes a first surface 166 and a second surface 167. Positioned on the surfaces 166, 167 and at a distance from each border 163, 164 are fold lines 165A, 165B.

The vertical divider panel 170 is defined by a first edge 171 opposing a second edge 172, each between a third edge 173 opposing a fourth edge 174. The first side panel 170 includes a first surface 176 and a second surface 177.

Figure 7:
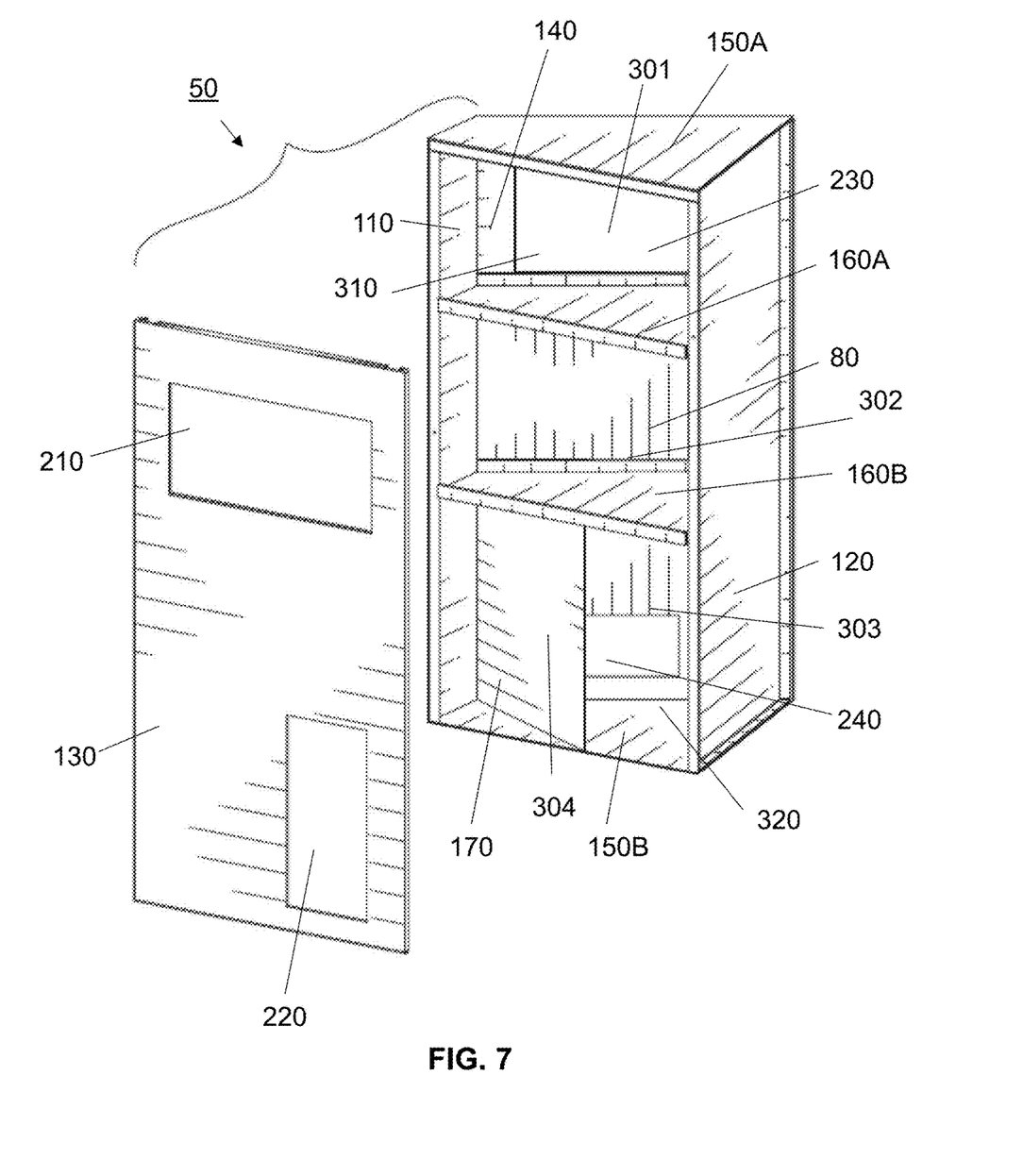
FIG. 7 illustrates an perspective rear view of the interior space of the apparatus according to an embodiment of the invention.
Figure 8:
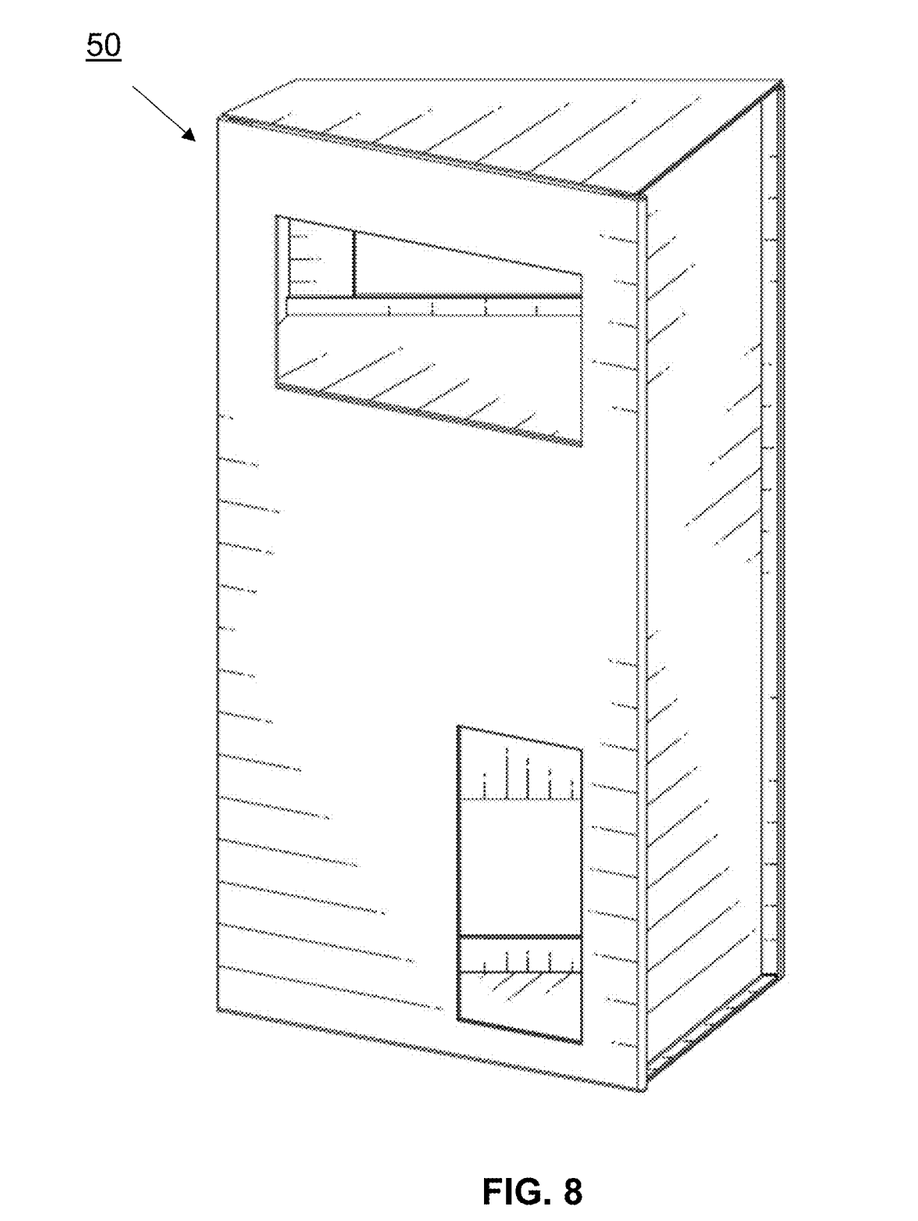
FIG. 8 illustrates an perspective rear view of the apparatus according to an embodiment of the invention.

FIG. 7 illustrates an perspective rear view of the interior space of the apparatus according to an embodiment of the invention and FIG. 8 illustrates a rear view of the apparatus according to an embodiment of the invention.

The apparatus may be fabricated from any material, including for example, metal, aluminum, wood, to name a few.

The apparatus 50 comprises a plurality of panels 110, 120, 130, 140, 150, 160, 170 secured together using any known product or method, for example, welding, gluing, taping, stapling, etc. It can be noted that the fold lines form flaps from portions of the panels that may be used to secure them together, e.g., via welding.

AS shown in FIG. 7, the apparatus 50 comprises a first side panel 110, second side panel 120, a first cutout side panel 130, a second cutout side panel 140, a first end panel 150A, and a second end panel 150B to form the body 75. As shown and described the body 75 comprises a first side panel 110 opposing a second side panel 120 such that surfaces 116, 126 are substantially parallel and positioned between two panels—a first side panel 130 and a second side panel 140.

In preferred embodiments, the apparatus comprises two additional panels to enclose the body 75. As shown, two end panels 150A, 150B are secured to the side panels 110, 120 and the side panels 120, 130. More specifically, surface 156 of a first end panel 150A is secured to edge 113 and border 123 of side panels 110 and 120, respectively. Surface 156 is secured also to edge 133 and border 143 of side panels 130 and 140, respectively.

A surface 156 of a second end panel 150B is secured to edge 114 and border 124 of side panels 110 and 120, respectively. Surface 156 of the second end panel 150 is secured also to edge 134 and border 144 of side panels 130 and 140, respectively.

In the embodiment shown, the panels are assembled to one another to form an apparatus with a quadrilateral cross-sectional shape. However, any shape is contemplated dependent upon the shelter size and volume.

As an example, the cross-sectional shape of an embodiment of the apparatus may form a trapezoid or a four-sided polygon with four angles. These angles may be approximately 70°. 90°, 95°, 105°, to provide the most efficient air flow from the HVAC system to an inside volume of a shelter. These angles are for exemplary purposes, i.e., these angles may be different to achieve efficient air flow depending upon the shelter size and volume. Efficient air flow refers to the preferred maintenance (e.g., cooling) of components within the shelter.

To form channels 310, 320 that direct the air flow, dividers are installed in the interior space 80. As shown in this embodiment, a first horizontal divider panel 160A and a second horizontal divider panel 160B and one vertical divider panel 170 are used. It is contemplated that any number of horizontal and vertical dividers may be used to achieve efficient air flow.

A first horizontal divider 160 is secured within the body 75 such that it is located near aperture elements 210, 230. Specifically, border 163 is positioned near boundary 232 of aperture element 230 of side panel 140 and border 164 is positioned near boundary 212 of aperture element 210 of side panel 130. Furthermore, border 162 is secured to surface 116 of side panel 110 and border 161 is secured to surface 126 of side panel 120.

A second horizontal divider 160 is secured within the body 75 such that it is located near aperture elements 220, 240. Specifically, border 163 is positioned on surface 146 of side panel 140 and border 164 is positioned near boundary 221 of aperture element 220 of side panel 130. Like the first horizontal divider, border 162 is secured to surface 116 of side panel 110 and border 161 is secured to surface 126 of side panel 120.

A vertical divider 170 is secured within the body such that it is located near aperture elements 220, 240. Specifically, edge 171 is secured to surface 167 of panel 160, edge 172 is secured to surface 157 of end panel 150, edge 172 is positioned near boundary 243 of aperture element 240 of side panel 140, and edge 173 is positioned near boundary 223 of aperture element 220 of side panel 130.

Within the body 75 of the apparatus 50, four compartments 301, 302, 303, 304 are formed by the horizontal dividers 160A, 160B and the vertical divider 170. A first compartment 301 and third compartment 303 form channels 310, 320. And the second compartment 302 and fourth compartment 304 are enclosed.

Specifically, a first channel 310 includes the first aperture 210 and the third aperture 230 and is defined by the first end panel 150A and the first horizontal divider panel 160A, along with portions of the first side panel 110, second side panel 120, the first cutout side panel 130, and the second cutout side panel 140. The second channel 320 includes the second aperture 220 and the fourth aperture 240 and is defined by the second end panel 150B, the second horizontal divider panel 160B, and the vertical divider panel 170 along with portions of the first side panel 110, second side panel 120, the first cutout side panel 130, and the second cutout side panel 140.

The second compartment 302 is enclosed by the divider panels 160A, 160B along with portions of the first side panel 110, second side panel 120, the first cutout side panel 130, and the second cutout side panel 140. The fourth compartment 304 is enclosed by the vertical divider panel 170 along with portions of the second divider panel 160B the second end panel 150B, the first side panel 110, and the first cutout side panel 130.

The apparatus is configured for installation on a controlled environment shelter. One side panel 140 is positioned near the HVAC system and the other panel 130 is positioned on the wall outside the shelter. The apertures 210, 220, 230, 240 of each panel are of a shape and an orientation to permit efficient air flow from the HVAC system through the apparatus and to the inside volume of the shelter as well as to permit air flow from the inside volume of the shelter through the apparatus. Specifically, divider panels form channels that direct air flow from an HVAC system to the inside volume of the shelter. According to this embodiment, air flow is received by the apparatus from an HVAC system via an aperture configured as a horizontal rectangle, but the air flow is supplied to the shelter via an aperture configured as a vertical rectangle, i.e., the channel formed by the divider panels within the interior space directs the air flow through the apparatus.

The embodiments described herein are to be considered in all respects only as illustrative and not restrictive, and the scope of the invention is not limited to the foregoing description. Those of skill in the art will recognize changes, substitutions and other modifications that will nonetheless come within the scope of the invention and range of the claims.

The invention claimed is:

1. An apparatus configured to direct airflow between a controlled environment shelter and a HVAC system, wherein the apparatus comprises:
   a plurality of panels forming a body with an interior space, two opposing panels of the body each including aperture elements, three divider panels positioned within the interior space of the body, each divider panel partitions the interior space into at least a first compartment and a second compartment, wherein the first and the second compartments each form a channel, a first channel consisting of a first aperture element and a third aperture element and a second channel consisting of a second aperture element and a fourth aperture element, wherein the channels direct air flow between the controlled environment shelter and the HVAC system.

2. The apparatus of claim 1, wherein the body is fabricated from aluminum.

3. The apparatus of claim 1, wherein the aperture elements are shaped as a rectangle.

4. The apparatus of claim 3, wherein the first compartment includes a horizontally positioned rectangle of a first aperture element on the panel downstream from a horizontally positioned rectangle of a second aperture element on the opposing panel.

5. The apparatus of claim 4, wherein the second compartment includes a vertically positioned rectangle of a third aperture element on the panel downstream from a horizontally positioned rectangle of a fourth aperture element on the opposing panel.

6. The apparatus of claim 1, wherein the two opposing panels of the body are not parallel.

7. The apparatus of claim 1, wherein the apparatus has a shape of a polygon parallelepiped.

8. The apparatus of claim 7, wherein the plurality of panels of the apparatus form the shape of the polygon parallelepiped with two adjacent panels forming angles of 70°, 90°, 95°, 105°.

9. An apparatus for use with a controlled environment shelter and positioned between an outside wall of the controlled environment shelter and a HVAC system, the apparatus comprising:
a polygon parallelepiped shaped body comprising a plurality of panels that form an interior space,
a first panel of the plurality of panels opposing a second panel of the plurality of panels,
the first panel comprising a first aperture element spaced apart form a second aperture element,
the second panel comprising a third aperture element spaced apart form a fourth aperture element,
at least one divider panel positioned within the interior space of the body, the at least one divider panel partitioning the interior space into a first channel and a second channel,
the first channel including the first aperture element downstream from the third aperture element, and configured to direct air flow from the HVAC system to the interior space,
the second channel including the second aperture element downstream from the fourth aperture element, and configured to direct airflow from the interior space to outside the controlled environment shelter.

10. The apparatus of claim 9, wherein the apparatus is made from aluminum.

11. The apparatus of claim 9, wherein each of the first aperture element, the second aperture element, the third aperture element, and the fourth aperture are shaped as a rectangle.

12. The apparatus of claim 9, wherein one of the first aperture element, the second aperture element, the third aperture element, and the fourth aperture element has a shape of a vertically oriented rectangle.

13. The apparatus of claim 9, wherein the first panel and the second panel are not parallel.

14. The apparatus of claim 9, wherein the plurality of panels of the apparatus are constructed in the shape of the polygon parallelepiped with two adjacent panels forming angles of 70°, 90°, 95°, 105°.

15. An aluminum apparatus for use with a controlled environment shelter and positioned between an outside wall of the controlled environment shelter and a HVAC system, the apparatus comprising:
a polygon parallelepiped shaped body comprising a plurality of panels that form an interior space,
a first panel of the plurality of panels opposing a second panel of the plurality of panels, and the first panel not parallel to the second panel,
the first panel comprising a first aperture element spaced apart form a second aperture element,
the second panel comprising a third aperture element spaced apart form a fourth aperture element,
at least one divider panel positioned within the interior space of the body, the at least one divider panel partitioning the interior space into a first channel and a second channel,
the first channel including the first aperture element downstream from the third aperture element, and configured to direct air flow from the HVAC system to the interior space,
the second channel including the second aperture element downstream from the fourth aperture element, and configured to direct airflow from the interior space to outside the controlled environment shelter, wherein each of the first aperture element, the second aperture element, the third aperture element, and the fourth aperture element are shaped as a rectangle.

16. The apparatus of claim 15, wherein one of the first aperture element, the second aperture element, the third aperture element, and the fourth aperture element has a shape of a vertically oriented rectangle.

* * * * *